(12) United States Patent
Casper

(10) Patent No.: US 6,359,817 B1
(45) Date of Patent: *Mar. 19, 2002

(54) CIRCUIT AND METHOD FOR TESTING A MEMORY DEVICE

(75) Inventor: Stephen L. Casper, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/640,611

(22) Filed: Aug. 17, 2000

Related U.S. Application Data

(62) Division of application No. 09/360,952, filed on Jul. 27, 1999, now Pat. No. 6,134,162, which is a continuation of application No. 09/031,973, filed on Feb. 26, 1998, now Pat. No. 5,943,276, which is a continuation of application No. 08/851,416, filed on May 5, 1997, now Pat. No. 5,822,258.

(51) Int. Cl.$^7$ .............................................. G11C 29/00
(52) U.S. Cl. ................... 365/201; 365/149; 365/189.09
(58) Field of Search ........................... 365/201, 189.09, 365/149, 189.01

(56) References Cited

U.S. PATENT DOCUMENTS

| 5,337,272 A | 8/1994 | Suwa et al. ................. 365/149 |
| 5,640,340 A | 6/1997 | Fink ........................... 365/149 |
| RE35,645 E | 10/1997 | Tobita ........................ 371/21.1 |
| 5,822,258 A | 10/1998 | Casper ........................ 365/201 |

FOREIGN PATENT DOCUMENTS

| JP | 10-40698 | * 2/1998 |

* cited by examiner

*Primary Examiner*—Hoai V. Ho
(74) *Attorney, Agent, or Firm*—Schwegman, Lundberg, Woessner & Kluth, P.A.

(57) ABSTRACT

A method for testing a memory device. The method writes test data to an array of cells of the memory device during a test mode. The method calls for driving a cell plate of the memory device during at least a portion of the test with a current level that is less than the current used during normal operation. This amplifies the affect of defective cells on the cell plate voltage thereby allowing identification of unacceptably weak cells with shorter, less strenuous tests.

34 Claims, 2 Drawing Sheets

CIRCUIT AND METHOD FOR TESTING A MEMORY DEVICE

This application is a Divisional of U.S. Ser. No. 09/360,952, filed Jul. 27, 1999, now U.S. Pat. No. 6,134,162 which is a continuation of U.S. Ser. No. 09/031,973 now U.S. Pat. No. 5,943,276, filed on Feb. 26, 1998, issued on Aug. 24, 1999, which is a continuation of U.S. Ser. No. 08/851,416 now U.S. Pat. No. 5,822,258, filed on May 5, 1997, issued Oct. 13, 1998.

TECHNICAL FIELD OF THE INVENTION

The present invention relates generally to the field of integrated circuits and, in particular, to a circuit and method for testing a memory device.

BACKGROUND OF THE INVENTION

Many electronic systems include a memory device, such as a Dynamic Random Access Memory (DRAM), to store data. A typical DRAM includes an array of memory cells. Each memory cell includes a capacitor that stores the data in the cell and a transistor that controls access to the data. The capacitor includes two conductive plates. One plate of each capacitor is typically coupled to a common node with a plate of each of the other capacitors. This plate is referred to as the "cell plate." The charge stored across the capacitor is representative of a data bit and can be either a high voltage or a low voltage.

Data can be either stored in the memory cells during a write mode, or data may be retrieved from the memory cells during a read mode. The data is transmitted on signal lines, referred to as digit lines, which are coupled to input/output (I/O) lines through transistors used as switching devices. For each bit of data stored, its true logic state is available on an I/O line and its complementary logic state is available on an I/O complement line. Thus, each memory cell has two digit lines, digit and digit complement.

Typically, the memory cells are arranged in an array and each cell has an address identifying its location in the array. The array includes a configuration of intersecting conductive lines and memory cells are associated with the intersections of the lines. In order to read from or write to a cell, the particular cell in question must be selected, or addressed. The address for the selected cell is represented by input signals to a word line decoder and to a digit line decoder. The word line decoder activates a word line in response to the word line address. The selected word line activates the access transistors for each of the memory cells in communication with the selected word line. The digit line decoder selects a digit line pair in response to the digit line address. For a read operation the selected word line activates the access transistors for a given word line address, and data is latched to the digit line pairs.

Inevitably, the fabrication process for a memory device will produce some defective cells. A cell is defective, for example, when the capacitor is not formed properly and acts as a short circuit thus preventing the cell from accurately storing data. These defective cells must be replaced for the memory device to function properly. To this end, designers typically provide a number of extra cells in a memory device. When the device is tested, bad cells are identified and repaired out with the extra cells using known techniques.

Cells in the area of a shorted cell may also be unacceptable for storing data due to the influence of the short circuit on the cell plate voltage. When a word line associated with a bad cell is fired, the shorted capacitor allows the sense amplifier to move the voltage on the cell plate by some amount in the region around the bad cell. Given enough time, the sense amplifier would pull the cell plate toward either the power supply voltage or ground potential. Thus, when the cells that surround a shorted capacitor are restored after a read, the cell plate is not at the correct voltage due to the influence of the short. Once the sense amplifier stops firing, the cell plate returns to its normal voltage during precharge/equilibration procedures. As the cell plate changes voltage, the stored potential on the other plate of the capacitor in each of these cells is also changed. Depending on the amount of movement of the cell plate voltage caused by the short, some adjacent cells may not provide reliable output. Since the amount of cell plate movement is a function of time, current testing techniques use long test periods to determine whether the shorted capacitor eventually will allow the cell plate to move too much so that adjacent cells prove to provide unacceptable results when tested.

For the reasons stated above, and for other reasons stated below which will become apparent to those skilled in the art upon reading and understanding the present specification, there is a need in the art for an improved circuit and method for testing a memory device.

SUMMARY OF THE INVENTION

The above mentioned problems with memory devices and other problems are addressed by the present invention and which will be understood by reading and studying the following specification. A circuit and method for testing a memory device is described which drives the cell plate with less current during at least a portion of the test mode so that the effect of a short circuited capacitor on surrounding cells is amplified and defective cells can be identified more quickly.

In particular, an illustrative embodiment of the present invention provides a method for testing a memory device. The method writes test data to an array of cells of the memory device during a test mode. The method calls for driving a cell plate of the memory device during at least a portion of the test with a current level that is less than the current used during normal operation. In one embodiment, the method drives the cell plate with the reduced current level while a sense amplifier is active during operation of the test. This amplifies the affect of defective cells on the cell plate voltage thereby allowing identification of unacceptably weak cells with shorter, less strenuous tests.

In another embodiment, the present invention provides a memory device. The memory device includes an array of memory cells that are accessible by addressing circuitry coupled to the array of memory cells. Each cell of the array includes a capacitor for storing data. The capacitors share a common cell plate. The memory device includes a voltage generator that is coupled to the cell plate to maintain the cell plate at a selected voltage. The voltage generator provides a first current level during a portion of a test mode and a second, different current level during normal operation. The reduced current level during test mode allows for quicker, less strenuous testing of the memory device to identify weak, unacceptable cells.

In another embodiment, the present invention provides a memory device. The memory device includes a number of memory cells. The memory cells each include a capacitor with one node coupled to a common cell plate. The memory device further includes a number of intersecting word and digit lines. The memory cells are addressably coupled at the intersections of the word and digit lines. The memory device includes a voltage generator coupled to the cell plate that provides an adjustable current output to drive the cell plate.

In another embodiment, the present invention provides a method for generating a voltage. The method provides for receiving a control signal that indicates a desired current level output. The method further provides for generating a voltage with a voltage generator. The method sets the output current level of the voltage generator in response to the control signal.

DETAILED DESCRIPTION OF THE INVENTION

In the following detailed description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
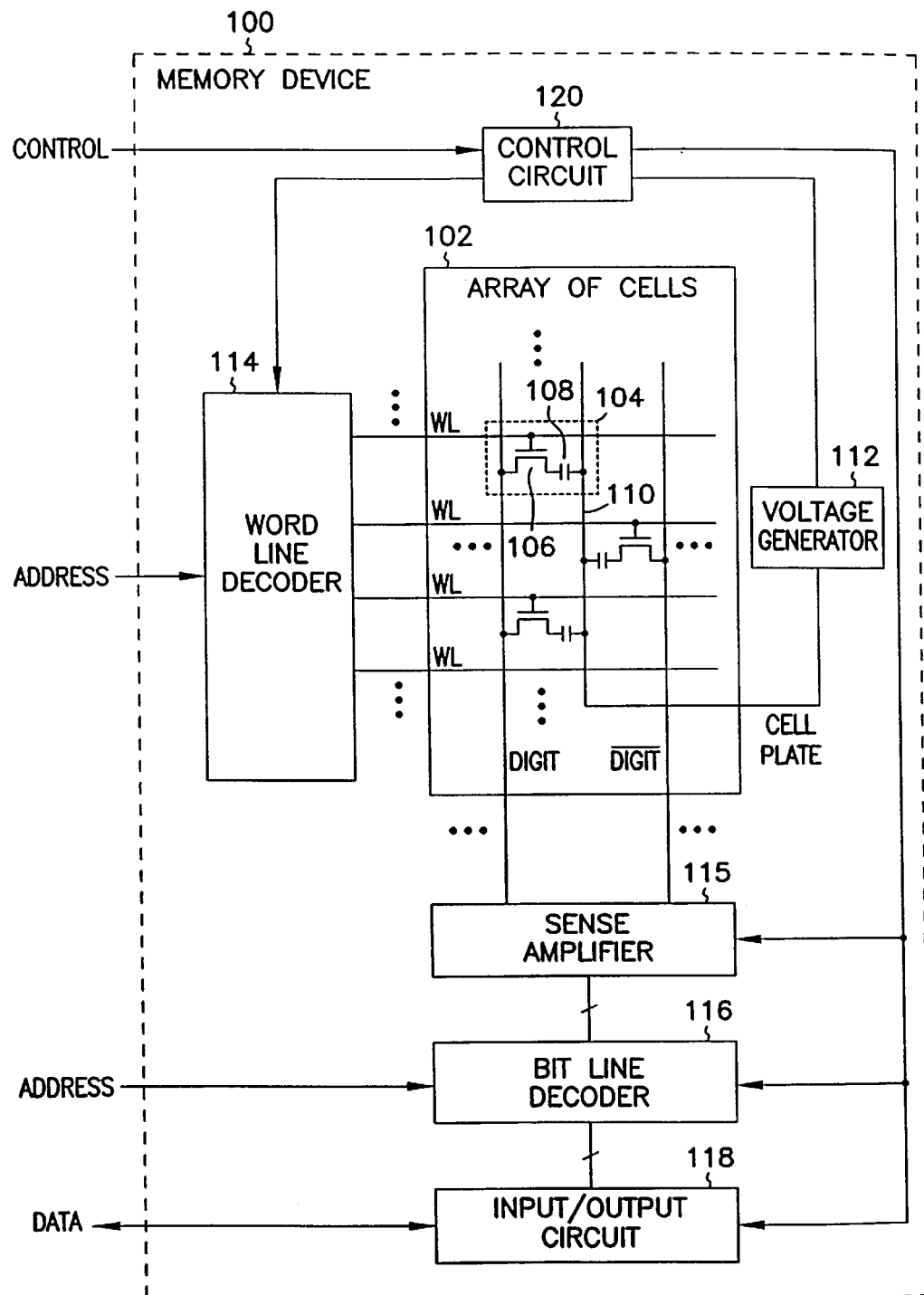
FIG. 1 is a block diagram of an illustrative embodiment of a memory device according to the teachings of the present invention.

FIG. 1 is a block diagram of an illustrative embodiment of the present invention. Memory device 100 includes array 102 of cells 104. Array 102 includes a number of word lines (WL) and a number of digit lines. The digit lines are provided in complementary pairs as is well know in the art. Each cell 104 is coupled to a word line and a digit line such that each cell is independently addressable.

Each cell 104 includes access transistor 106 and capacitor 108. A gate of access transistor 106 is coupled to a word line. A first source/drain region of access transistor 106 is coupled to a digit line. A second source/drain region of access transistor 106 is coupled to a first node of capacitor 108. A second node of capacitor 108 is coupled to cell plate 110.

Cell plate 110 is maintained at a substantially constant voltage by voltage generator 112. Typically, voltage generator 112 provides a bias voltage of approximately one-half of the supply voltage as is known in the art.

Memory device 100 further uses word line decoder 114 and digit line decoder 116 to determine which cell 104 of array 102 is to be accessed. Word line decoder 114 first determines the word line that is coupled to the selected cell. Further, word line decoder 114 includes circuitry that activates the word line for the selected cell. Digit line decoder 116 determines the pair of digit lines to be used for accessing the selected cell. Digit line decoder 116 provides this information to sense amplifier 115. Sense amplifier 115 passes data between input/output circuit 118 and array 102.

Control circuit 120 is coupled to voltage generator 112 to selectively establish the amount of drive current provided to cell plate 110. Control circuit 120 is also coupled to word line decoder 114, sense amplifier 115, digit line decoder 116 and input/output circuit 118.

In operation, memory device 100 stores data on capacitors 108 of cells 104. Prior to normal operation, memory device 100 is tested to identify cells with defective capacitors. Various data patterns, known to a person of ordinary skill in the art, are written to and read out from array 102 during the testing operation. Based on the output of these tests, defective cells are repaired out with redundant word lines or digit line pairs of array 102.

To aid in the early detection of defective cells, voltage generator 112 provides two different drive currents to cell plate 110. During normal operation, voltage generator 112 provides a first, higher current level. And, during at least a portion of the test mode, voltage generator 112 provides a second, lower drive current. For example, voltage generator 112 can provide a drive current during test mode that is one-half as much as the normal drive current. Advantageously, the lower drive current of voltage generator 112 used during at least a portion of the test mode amplifies the affect of a short circuited capacitor on the cell plate voltage so that cells that will provide unacceptable data during normal operation are identified more quickly during the test.

The manner in which the lower drive current amplifies the affect of the short is described with respect to storing a high logic value in an unacceptable cell. When a high logic value is written to the cell, input/output circuit 118 receives the high logic value over the DATA lines. Sense amplifier 115 drives the digit and digit complement lines of array 102 to voltages substantially equal to the power supply and ground potential. Word line decoder 114 drives access transistor 106 of cell 104 to pass the voltage on the digit line to capacitor 108. Thus, assuming that the power supply voltage is approximately 3 volts, the voltage on the first node of capacitor 108 is 3 volts. If there were no shorted capacitor in the area of the cell, the voltage on the second node of capacitor 108 (e.g., cell plate 110) would be one-half of the power supply voltage, or 1.5 volts. Thus, capacitor 108 would store the high logic value as a 1.5 volt difference between the first and second nodes. Since there is a short circuited cell in the area, the voltage on cell plate 110 moves from its normal voltage when sense amplifier 115 is active. When this happens, the voltage stored on capacitor 108 will vary from its expected range. The drive current from voltage generator 112 affects the amount by which the short circuit can move the voltage on cell plate 110. For example, by cutting the drive current of voltage generator 112 in half during the test mode, the shorted capacitor might move cell plate 110 by one volt or more as compared to less than half a volt with the normal drive current. With this change in the voltage of cell plate 110, the voltage stored on capacitor 108 is reduced to 0.5 volts or less (compared to 1 volt using typical drive current levels). Thus, the decreased drive current allows the test to identify this cell as defective more quickly.

Figure 2:
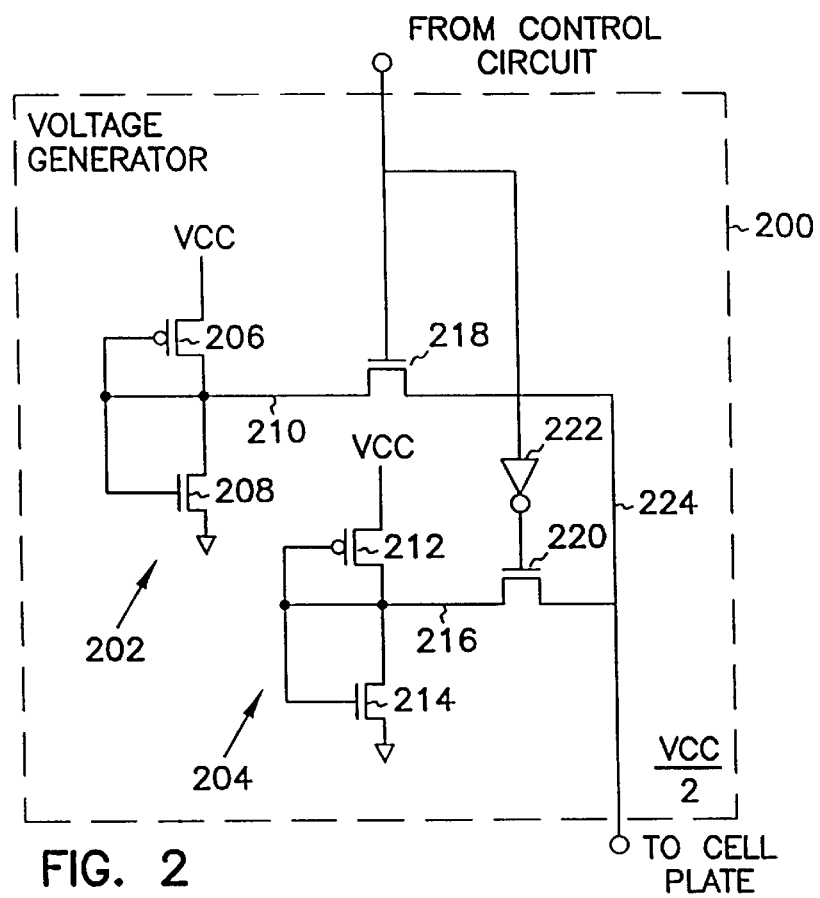
FIGS. 2 and 3 are schematic diagrams of embodiments of voltage generators for use with the memory device of FIG. 1.

FIG. 2 is a schematic diagram of a voltage generator, indicated generally at 200, that can be used to provide the variable drive current of voltage generator 112 of FIG. 1. Voltage generator 200 includes first and second voltage generators 202 and 204. First voltage generator 202 includes p-channel transistor 206 and n-channel transistor 208 that are coupled in a voltage divider configuration. The gates of transistors 206 and 208 are coupled together and are coupled to a common node 210 with a source/drain region of transistor 206 and a source/drain region of transistor 208. A source/drain region of transistor 206 is coupled to the power supply, $V_{CC}$, and a source drain region of transistor 208 is coupled to ground.

Second voltage generator 204 includes p-channel transistor 212 and n-channel transistor 214 that are coupled in the same configuration as first voltage generator 202. A gate of transistor 218 is coupled to receive a control signal from, for example, control circuit 120 of FIG. 1. A first source/drain region of transistor 218 is coupled to node 210 of first voltage generator 202. A second source/drain region of transistor 218 is coupled to node 224 as an output of voltage generator 200.

Transistor 220 is configured in a similar manner as transistor 218. A first source/drain region of transistor 220 is coupled to node 216. A second source/drain region of transistor 220 is coupled to output node 224. A gate of transistor 220 is coupled to an output of inverter 222. Inverter 222 inverts the control signal from, for example, control circuit 120 of FIG. 1 such that only one of transistors 218 and 220 is on at a given time.

In operation, voltage generator 200 selectively applies the output of first and second voltage generators 202 and 204 to output node 224 to drive, for example, the voltage of cell plate 110. When the control signal from control circuit 120 is high, voltage generator 202 is coupled by transistor 218 to provide the output current. When the control signal from control circuit 120 is low, voltage generator 204 is coupled by transistor 220 to provide the output current. By selecting appropriate widths for the transistors in first and second voltage generators 202 and 204, the drive current provided by voltage generator 202 can be set as a percentage of the drive current of voltage generator 204. This allows voltage generator 200 to provide lower drive current during test mode of a memory device so that defective cells can be identified faster and with less strenuous tests.

Figure 3:
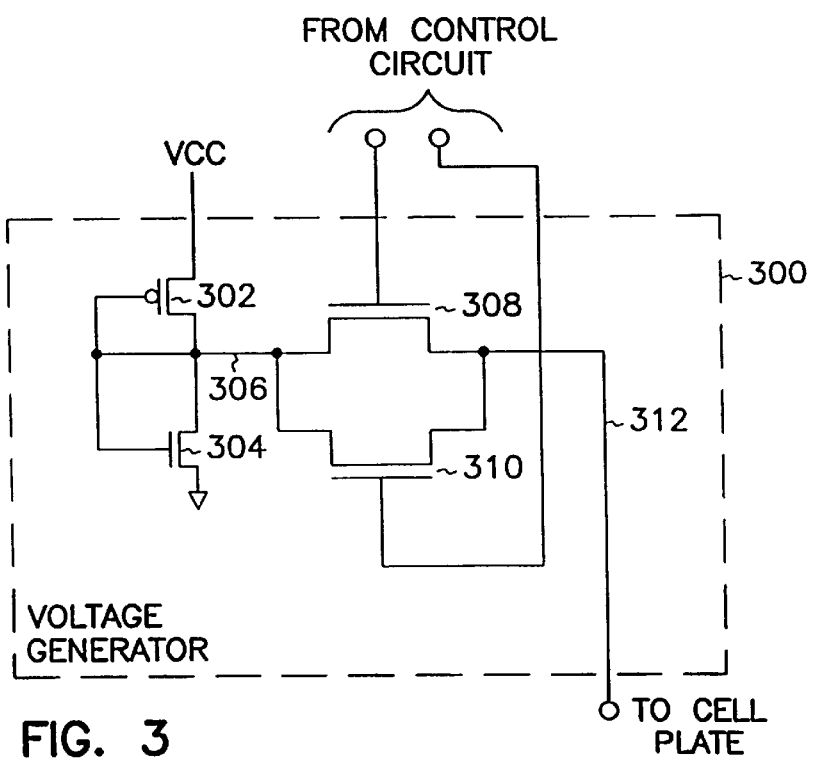

FIG. 3 is a schematic diagram of another embodiment of a voltage generator indicated generally at 300 and constructed according to the teachings of the present invention. Voltage generator 300 includes p-channel transistor 302 and n-channel transistor 304 that are coupled in a voltage divider configuration. Transistors 302 and 304 are fabricated such that the voltage at node 306 is approximately one-half of the power supply voltage ($V_{CC}$). Voltage generator 300 further includes gating transistors 308 and 310. A source/drain region of each transistor 308 and 310 is coupled to node 306. Further, a second source/drain region of each transistor 308 and 310 is coupled to output node 312. A gate of transistor 308 is coupled to receive a first control signal from, for example, control circuit 120 of FIG. 1. Similarly, a gate of transistor 310 is coupled to receive a second control signal from control circuit 210 of FIG. 1.

In operation, voltage generator 300 provides an output voltage that is a percentage of the power supply voltage with a variable drive current. First and second control signals from control circuit 120 selectively activate transistors 308 and 310. For example, transistor 308 can be sized to provide sufficient drive current during normal operation. Thus, the control signals from control circuit 120 turn transistor 308 on and transistor 310 off during normal operation. Further, during test mode, the control signals turn on transistor 310, which is sized to provide reduced drive current, during at least a portion of a test mode so that defects may be more readily identified. Alternatively, with appropriate sizing of transistors 308 and 310, transistor 308 can provide the drive current during normal operation and transistor 308 and 310 can provide the drive current during at least a portion of a test mode.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the teachings of the present invention are not limited to the voltage generators shown and described with respect to FIGS. 2 and 3. Other arrangements can be used that provide a variable drive current to the cell plate during normal and test mode operations. Further, the cell plate can be maintained at a voltage other than $V_{CC}/2$ as specified in FIG. 2.

What is claimed is:

1. A voltage generator, comprising:

at least a first integrated circuit transistor fabricated with an appropriate width to generate a normal drive current from a supply of electrical potential to operate a plurality of memory cells; and at least a second integrated circuit transistor fabricated with an appropriate width to generate a test drive current from the supply of electrical potential to test the memory cells for current leakage.

2. The voltage generator of claim 1, wherein the test drive current is lower than the normal drive current.

3. The integrated circuit voltage generator of claim 1, wherein:

the first integrated circuit transistor forms a part of a first voltage generator adapted for providing the normal drive current during normal operation; and the second integrated circuit transistor forms a part of a second voltage generator adapted for providing the test drive current during a test mode.

4. The integrated circuit voltage generator of claim 1, wherein:

the first integrated circuit transistor comprises a first pass through transistor adapted for providing the normal drive current during normal operation; and the second integrated circuit transistor comprises a second pass through transistor adapted for providing the test drive current during a test mode.

5. A voltage generator, comprising:

a first voltage generator adapted for providing a normal drive current during normal operation; and a second voltage generator adapted for providing a test drive current during at least a portion of a test mode.

6. The voltage generator of claim 5, wherein the test drive current is lower than the normal drive current.

7. The voltage generator of claim 5, wherein:

the first voltage generator includes a first voltage divider and a first pass transistor coupled in series between an output of the first voltage divider and a generator output; and the second voltage generator includes a second voltage divider and a second pass transistor coupled in series between an output of the second voltage divider and the generator output.

8. The voltage generator of claim 5, wherein:

the first voltage generator includes:

a first voltage divider having a first n-channel transistor coupled to a first p-channel transistor in a voltage divider configuration to form a first voltage divider output, wherein the first n-channel transistor and the first p-channel are fabricated with an appropriate width to provide a desired current; and a first pass transistor coupled in series between the first voltage divider output and a generator output, wherein the normal drive current flows through an actuated first pass transistor; and the second voltage generator includes:
a second voltage divider having a second n-channel transistor coupled to a second p-channel transistor in a voltage divider configuration to form a second voltage divider output, wherein the second n-channel transistor and the second p-channel are fabricated with an appropriate width to provide a desired current; and a second pass transistor coupled in series between the second voltage divider output and the generator output, wherein the lower test drive current flows through an actuated second pass transistor.

9. The voltage generator of claim 5, wherein:
the normal drive current is sufficient to operate a plurality of memory cells; and
the test drive current is limited to enhance testing of the memory cells for circuit leakage.

10. A voltage generator, comprising:
a voltage divider having a voltage divider output;
a first pass transistor coupled in series between the voltage divider output and a generator output, wherein the first pass transistor is fabricated with an appropriate width such that an actuated first pass transistor provides a normal drive current; and
a second pass transistor coupled in series between the voltage divider output and the generator output, wherein the second pass transistor is fabricated with an appropriate width such that an actuated second pass transistor provides a lower test drive current.

11. The voltage generator of claim 10, wherein the voltage divider comprises an n-channel transistor coupled to a p-channel transistor in a voltage divider configuration to form the voltage divider output.

12. The voltage generator of claim 10, wherein:
the normal drive current is sufficient to operate a plurality of memory cells; and
the test drive current is limited to enhance testing of the memory cells for circuit leakage.

13. A voltage generator, comprising:
a source of electric potential;
a first pass transistor coupled in series between the source of electric potential and a generator output, wherein the first pass transistor is fabricated with an appropriate width such that an actuated first pass transistor provides a normal drive current; and
a second pass transistor coupled in series between the source of electric potential and the generator output, wherein the second pass transistor is fabricated with an appropriate width such that an actuated second pass transistor provides a lower test drive current.

14. The voltage generator of claim 13, wherein the source of electrical potential is a voltage divider coupled to a power supply connection.

15. The voltage generator of claim 13, wherein the source of electrical potential is a voltage divider, comprising an n-channel transistor coupled to a p-channel transistor in a voltage divider configuration to form a voltage divider output.

16. The voltage generator of claim 13, wherein:
the normal drive current is sufficient to operate a plurality of memory cells; and
the test drive current is limited to enhance testing of the memory cells for circuit leakage.

17. A voltage generator, comprising:
a power supply connection;
a control signal input;
a generator output;
a first generator circuit operably connected to the power supply connection and to the control signal input, wherein the first generator circuit produces a normal drive current at the generator output upon receiving a normal control signal at the control signal input; and
a second generator circuit operably connected to the power supply connection and to the control signal input, wherein the second generator circuit produces a test drive current at the generator output upon receiving a test control signal at the control signal input.

18. The voltage generator of claim 17, wherein:
the first generator circuit includes:
a first voltage divider having a first voltage divider output; and
a first pass through transistor coupled in series between the first voltage divider output and the generator output, wherein a gate of the first pass through transistor is coupled to the control signal input such that the normal control signal actuates the first pass through transistor; and the second generator includes:
a second voltage divider having a second voltage divider output; and
a second pass through transistor coupled in series between the second voltage divider output and the generator output, wherein a gate of the second pass through transistor is coupled to the control signal input such that the normal control signal actuates the second pass through transistor.

19. The voltage generator of claim 17, wherein:
the normal drive current is sufficient to operate a plurality of memory cells; and
the test drive current is limited to enhance testing of the memory cells for circuit leakage.

20. The voltage generator of claim 17, wherein the test drive current is lower than the normal drive current.

21. The voltage generator of claim 17, wherein:
the normal drive current is sufficient to operate a plurality of memory cells; and
the test drive current is limited to enhance testing of the memory cells for circuit leakage.

22. A voltage generator, comprising:
a power supply connection;
a control signal input;
a generator output;
a first voltage divider coupled to the power supply connection, wherein the first voltage divider has a first voltage divider output;
a first pass through transistor coupled in series between the first voltage divider output and the generator output, wherein:
a gate of the first pass through transistor is coupled to the control signal input such that a normal control signal at the control signal input actuates the first pass through transistor; and
an actuated first pass through transistor provides a normal drive current at the generator output;
a second voltage divider coupled to the power supply connection, wherein the second voltage divider has a second voltage divider output; and a second pass through transistor coupled in series between the second voltage divider output and the generator output, wherein:
- a gate of the second pass through transistor is coupled to the control signal input such that a test control signal at the control signal input actuates the second pass through transistor; and
- an actuated second pass through transistor provides a test drive current at the generator output.

23. The voltage generator of claim 22, wherein both the first voltage divider and the second voltage divider have an n-channel transistor coupled to a p-channel transistor in a voltage divider configuration.

24. The voltage generator of claim 22, wherein:
- both the first voltage divider and the second voltage divider have an n-channel transistor coupled to a p-channel transistor in a voltage divider configuration;
- the transistors of the first voltage divider are fabricated with an appropriate width to generate the normal drive current; and
- the transistors of the second voltage divider are fabricated with an appropriate width to generate the test drive current.

25. The voltage generator of claim 22, wherein the generator output is coupled to a common node for a plurality of memory cells.

26. The voltage generator of claim 22, wherein the test drive current is lower than the normal drive current.

27. A voltage generator, comprising:
- a power supply connection;
- a control signal input;
- a generator output;
- a voltage divider having a voltage divider output;
- a first pass transistor coupled in series between the voltage divider output and the generator output, wherein the first pass transistor is fabricated with an appropriate width such that an actuated first pass transistor provides a normal drive current; and
- a second pass transistor coupled in series between the voltage divider output and the generator output, wherein the second pass transistor is fabricated with an appropriate width such that an actuated second pass transistor provides a test drive current.

28. The voltage generator of claim 27, wherein the voltage divider comprises an n-channel transistor coupled to a p-channel transistor in a voltage divider configuration to form the voltage divider output.

29. The voltage generator of claim 27, wherein the voltage divider has an n-channel transistor coupled to a p-channel transistor in a voltage divider configuration.

30. The voltage generator of claim 27, wherein the generator output is coupled to a common node for a plurality of memory cells.

31. The voltage generator of claim 27, wherein the test drive current is lower than the normal drive current.

32. The voltage generator of claim 27, wherein:
- the normal drive current is sufficient to operate a plurality of memory cells; and
- the test drive current is limited to enhance testing of the memory cells for circuit leakage.

33. A voltage generator, comprising:
- a control signal input;
- a generator output;
- a source of electric potential;
- a first pass transistor coupled in series between the source of electric potential and the generator output, wherein the first pass transistor is fabricated with an appropriate width such that an actuated first pass transistor provides a normal drive current; and
- a second pass transistor coupled in series between the source of electric potential and the generator output, wherein the second pass transistor is fabricated with an appropriate width such that an actuated second pass transistor provides a test drive current.

34. The voltage generator of claim 33, wherein the source of electrical potential is a voltage divider coupled to a power supply connection.

* * * * *